(12) United States Patent
Saeedi et al.

(10) Patent No.: US 8,773,573 B1
(45) Date of Patent: Jul. 8, 2014

(54) ADJUSTABLE LENS ARRAY WITH VARIABLE OPTICAL POWER

(71) Applicant: Google Inc., Mountain View, CA (US)

(72) Inventors: Ehsan Saeedi, Santa Clara, CA (US); Xiaoyu Miao, Sunnyvale, CA (US)

(73) Assignee: Google Inc., Mountain View, CA (US)

( * ) Notice: Subject to any disclaimer, the term of this patent is extended or adjusted under 35 U.S.C. 154(b) by 9 days.

(21) Appl. No.: 13/742,201

(22) Filed: Jan. 15, 2013

(51) Int. Cl.
*H04N 5/225* (2006.01)
*G02B 7/02* (2006.01)

(52) U.S. Cl.
USPC .......................................... 348/340; 359/822

(58) Field of Classification Search
USPC ............ 348/335, 340–344; 359/198.1, 201.1, 359/227, 363, 819, 822
See application file for complete search history.

(56) References Cited

U.S. PATENT DOCUMENTS

| | | | |
|---|---|---|---|
| 5,184,224 A * | 2/1993 | Mitani et al. ................... | 348/744 |
| 5,191,472 A | 3/1993 | Kurematsu et al. | |
| 5,870,224 A | 2/1999 | Saitoh et al. | |
| 6,256,149 B1 | 7/2001 | Rolfe | |
| 7,895,780 B2 | 3/2011 | Lee | |
| 8,253,839 B2 * | 8/2012 | Chang ........................... | 348/335 |
| 2010/0284077 A1 * | 11/2010 | Shyu et al. ..................... | 359/503 |
| 2011/0261466 A1 | 10/2011 | Buch et al. | |
| 2013/0088637 A1 * | 4/2013 | Duparre ......................... | 348/360 |
| 2014/0016015 A1 * | 1/2014 | Miao .............................. | 348/345 |

FOREIGN PATENT DOCUMENTS

| WO | WO 2012/003529 A1 | 1/2012 |
|---|---|---|
| WO | WO 2012/056817 A1 | 5/2012 |

OTHER PUBLICATIONS

Adlens, "Emergensee," Adlens Variable Focus Eyewear, 3 page brochure downloaded from the Internet on Nov. 14, 2012 from www.adlens.com.
Adlens, "Hemisphere Instant Prescription Eyeware," Adlens Variable Focus Eyewear, 4 page brochure downloaded from the Internet on Nov. 14, 2012 from www.adlens.com.
Adlens, "John Lennon Collection," Adlens Variable Focus Eyewear, 4 page brochure downloaded from the Internet on Nov. 14, 2012 from www.adlens.com.
Adlens, "Emergensee," Adlens Variable Focus Eyewear, www.adlens.corn, 3 page brochure.
Adlens, "Hemisphere Instant Prescription Eyeware," Adlens Variable Focus Eyewear, www.adlens.com, 4 page brochure.
Adlens, "John Lennon Collection," Adlens Variable Focus Eyewear, www.adlens.com, 4 page brochure.

* cited by examiner

*Primary Examiner* — Kelly L Jerabek
(74) *Attorney, Agent, or Firm* — Blakely Sokoloff Taylor & Zafman LLP

(57) ABSTRACT

A camera system includes an image sensor, an aperture, and an adjustable lens. The adjustable lens is disposed in an optical path of the image sensor to focus image light received through the aperture onto a pixel array of the image sensor. The adjustable lens includes first and second lens members and blackout regions. The first lens member includes a first corrugated surface and a first flat surface opposite the first corrugated surface. The first corrugated surface includes a periodic structure of alternating ridge and groove sections. The second lens member includes a second corrugated surface and a second flat surface opposite the second corrugated surface. The second flat surface faces the first flat surface. The blackout regions are disposed between the first and second corrugated surfaces and positioned to block the image light passing through either the ridge or the groove sections of the first lens member.

21 Claims, 7 Drawing Sheets

ADJUSTABLE LENS ARRAY WITH VARIABLE OPTICAL POWER

TECHNICAL FIELD

This disclosure relates generally to the field of optics, and in particular but not exclusively, relates to adjustable lenses.

BACKGROUND INFORMATION

A camera lens, often referred to as an objective lens, is an optical lens or lens assembly that produces an image on the surface of an image sensor or other photographic capable medium. A camera lens may be a fixed focus lens with a fixed focal length lens assembly, or a variable focus lens with a variable focal length lens assembly. Fixed focus lenses typically contain fewer components, are less expensive, and less bulky compared to variable focus lenses. Additionally, variable focus lenses often require an auto-focus mechanism that consumes power. As such, fixed focal length lenses are often used in portable electronic devices (e.g., cell phones, etc.) where size, cost, and power consumption are important. However, fixed focal length lenses tradeoff image sharpness and depth of field for the aforementioned benefits. Rather than determining the correct focusing distance and adjusting the lens assembly to the determined focal point, a fixed-focus lens simply relies on sufficient depth of field to produce acceptably sharp images.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. The drawings are not necessarily to scale, emphasis instead being placed upon illustrating the principles being described.

DETAILED DESCRIPTION

Embodiments of a system, apparatus, and method of operation for an adjustable lens are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Embodiments disclosed herein facilitate a miniature lens assembly for use with a camera system or a display system that can provide variable optical power. The variable optical power can be used to implement a variable focus function (e.g., auto-focus) or a variable zoom function in a compact form factor.

Figure 1:
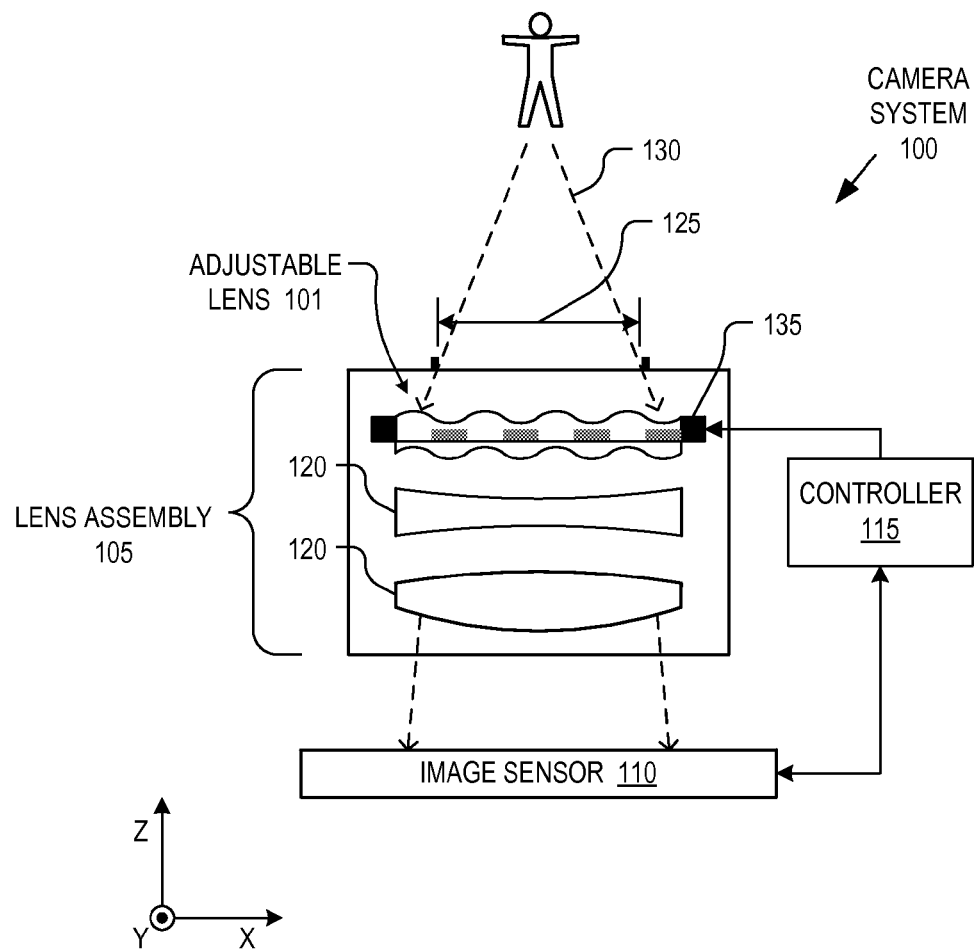
FIG. 1 is a functional block diagram illustrating a camera system including an adjustable lens, in accordance with an embodiment of the disclosure.

FIG. 1 is a functional block diagram illustrating a camera system 100 including an adjustable lens 101, in accordance with an embodiment of the disclosure. The illustrated embodiment of camera system 100 includes a lens assembly 105, an image sensor 110, and a controller 115. The illustrated embodiment of lens assembly 105 includes adjustable lens 101, lens elements 120, an aperture 125 through which image light 130 enters into lens assembly 105, and an actuator 135.

During operation, adjustable lens 101 is adjustable to provide variable optical power. In the illustrated embodiment, adjustable lens 101 includes sub-components that are physically moved along a lateral translating path (i.e., lateral to the depth of field direction or z-axis in FIG. 1) relative to each other. These components are moved relative to each other via actuator 135. In one embodiment, the optical power of adjustable lens 101 may be adjusted in real-time via actuator 135 under the influence and control of controller 115.

Since adjustable lens 101 is capable of variable optical power (and therefore a variable focal length), the other lens elements 120 can remain fixed at static locations. Since one or more components of adjustable lens 101 move laterally (not vertically), the height of lens assembly 105 along the z-axis can remain relatively compact compared to conventional lens assemblies that move optical elements along the depth of field direction (z-axis). In the illustrated embodiment, lens elements 120 are fixed optical elements that remain stationary. Lens elements 120 may serve various functions depending upon the type of lens assembly 105 (e.g., fixed zoom, but variable focus; variable zoom; or otherwise). Lens elements 120 may serve to correct optical aberrations, focus image light 130, or otherwise. Although FIG. 1 illustrates lens assembly 105 as including two lens elements 120 disposed between image sensor 110 and adjustable lens 101, in other embodiments, lens assembly 105 may include only one lens element 120 or more than two lens elements 120. Furthermore, adjustable lens 101 need not be the first optical element inline next to aperture 125; rather, other embodiments may include one or more fixed lens elements 120 disposed in front of or behind adjustable lens 101 within (or external to) lens assembly 105.

Image sensor 110 may be implemented using a variety of different image sensor technologies. For example, image sensor 110 may be a backside or frontside complementary metal-oxide-semiconductor ("CMOS") image sensor, a charged coupled device ("CCD") image sensor, or otherwise. Image sensor 110 includes a pixel array for capturing image light received through aperture 125 and focused by lens assembly 105. Image sensor 110 may be a monochrome image sensor or a full color image sensor with a color filter array ("CFA") disposed over a pixel array of photosensitive elements. In some embodiments, an array of microlenses may be disposed over the CFA to improve quantum efficiency of the image sensor. Aperture 125 may be an opening in a housing of lens assembly 105 or simply the cross-sectional area of the light cone of image light 130 incident upon adjustable lens 101 that is focused onto image sensor 110.

Controller 115 is coupled to actuator 135 to control the physical manipulation of adjustable lens 101 to adjust the focus and/or zoom of lens assembly 105. In one embodiment, controller 115 is further coupled to image sensor 110 to receive feedback information for auto-focus or otherwise. Controller 115 includes logic and/or control systems (e.g., drivers, PID controllers, etc.) implemented in hardware (e.g., application specific integrated circuit, field programmable gate array, hardware logic gates, etc.), implemented as software or firmware executed on a general purpose processor, or a combination of both. Actuator 135 may be implemented using a variety of actuation system including a piezo-electric crystal, a microelectromechanical system ("MEMS"), a voice coil linear motor, an electrostatic actuator, or otherwise.

Figure 2A:
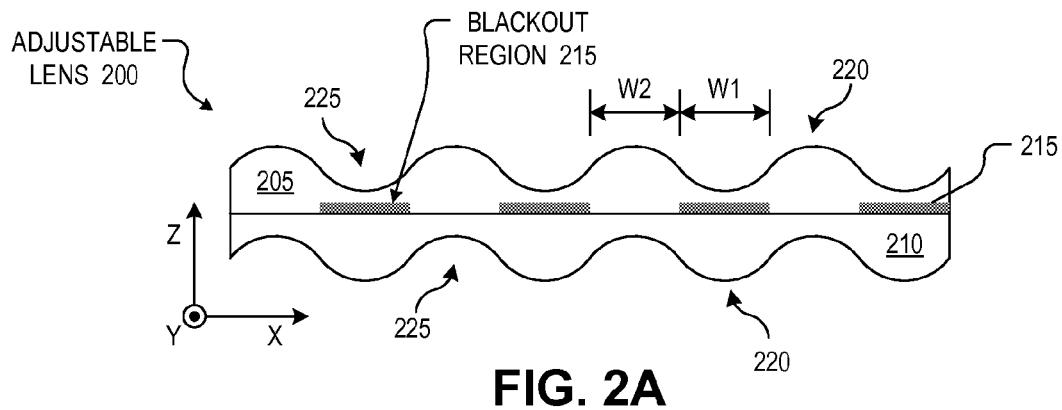
FIGS. 2A-2C illustrates various views of an adjustable lens, in accordance with an embodiment of the disclosure.
Figure 2B:
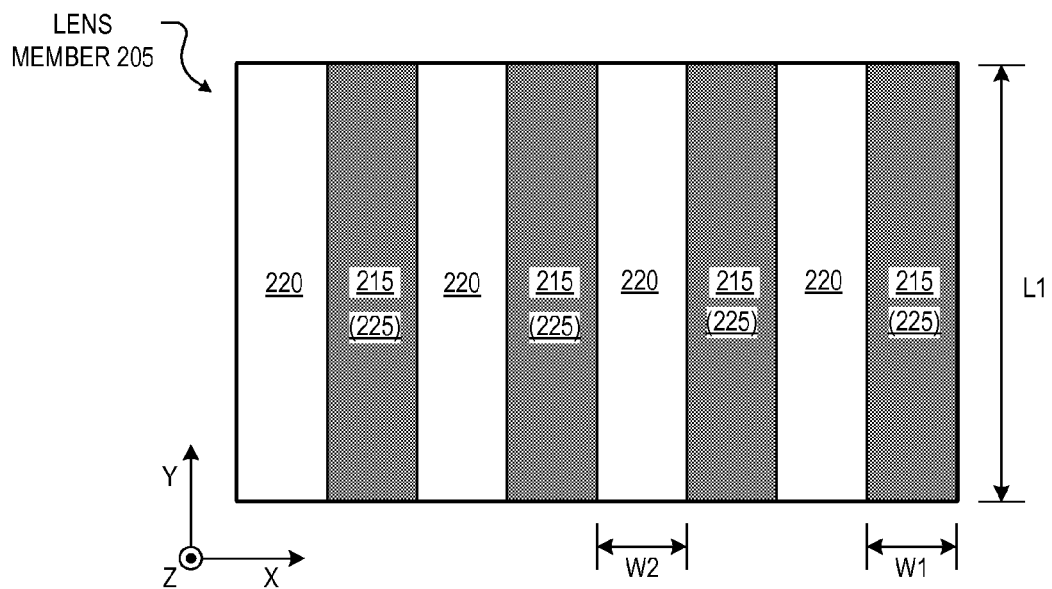
Figure 2C:
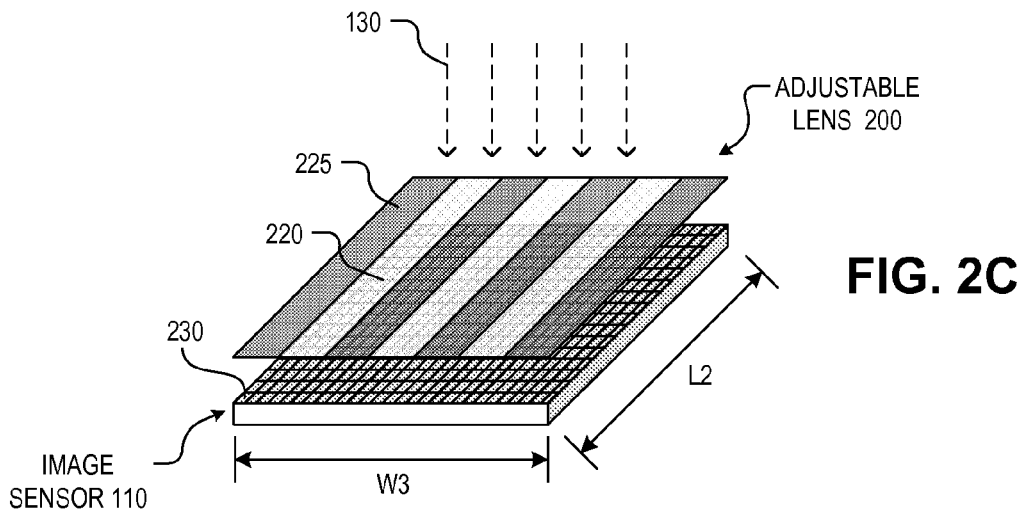

FIGS. 2A-2C illustrates various views of an adjustable lens 200, in accordance with an embodiment of the disclosure. Adjustable lens 200 is one possible implementation of adjustable lens 101 illustrated in FIG. 1. The illustrated embodiment of adjustable lens 200 includes lens member 205, lens member 210, and blackout regions 215. Each lens member 205 has a corrugated surface and a flat surface. Lens members 205 and 210 are positioned back-to-back such that the flat surfaces of each lens member faces one another. The corrugated surface of each lens member 205 and 210 is a periodic structure of alternating ridge sections 220 and groove sections 225.

Ridge sections 220 have a width W1 and groove sections 225 have a width W2. Referring to the top view of lens member 205 illustrated in FIG. 2B, ridge sections 220 and groove sections 225 are elongated column structures with a length L1. In the illustrated embodiment, W1=W2, which is less than L1. In one embodiment, lens members 205 and 210 are index matched materials that have an index of refraction higher than air. For example, lens members 205 may be made of glass or optical grade plastic (e.g., Zeonex-E48R). Other relative dimensions and materials of the subcomponents described above may be used.

Blackout regions 215 are positioned between the corrugated surfaces to block portions of the image light 130 passing through adjustable lens 200. In one embodiment, blackout regions 215 have the same dimensions as either one of ridge sections 220 or groove sections 225 and are positioned in a repeating pattern to block image light 130 passing through ridge sections 220, or alternatively, groove sections 225 of either the upper or lower lens member 205 or 210. In the example of FIG. 2A, blackout regions 215 are positioned to block image light 130 from passing through groove sections 225 of lens member 205. Blackout regions 215 may be made of a variety of opaque materials (e.g., black paint). Blackout regions 215 may be disposed in or on the flat surface of either the upper lens member 205 (illustrated) or lower lens member 210. Blackout region s 215 obscure half of the lens array formed by the corrugated surfaces so that the non-obscured portions provide either only positive optical power or only negative optical power.

FIG. 2C illustrates approximate relative sizes of lens members 205 and 210 relative to the pixels 230 of image sensor 110. As illustrated, lens members 205 and 210 each include a plurality of ridge sections 220 and groove sections 225 that collectively span the width W3 of the entire pixel array of image sensor 110. However, in the illustrated embodiment, each ridge section 220 and groove section 225 spans the entire length L2 of the pixel array of image sensor 110. Referring to FIG. 1, the plurality of ridge sections 220 and groove sections 225 of lens members 205 and 210 also collectively span the width of aperture 125, but each individually span the length of aperture 125. The length and width dimensions discussed herein are orthogonal dimensions.

Returning to FIG. 2C, each ridge section 220 and groove section 225 of lens members 205 or 210 subtends (covers) a plurality of image pixels in both the width and length dimensions. In other words, each ridge section 220 has a width W2 that is greater than two times the pixel pitch of image sensor 110. Similarly, each groove section 225 has a width W1 that is greater than two times the pixel pitch of image sensor 110. In fact, the widths W1 and W2 may be many times greater than the pitch of the pixels they subtend. For example, the periodic structure of the corrugated surfaces may have a period of 100 μm (e.g., W1=50 μm and W2=50 μm) while the pixel pitch of image sensor 110 may be 1.4 μm. In one embodiment, the widths W1 and/or W2 should be large enough so that the pattern of blackout regions 215 do not cause diffraction in the visible spectrum of light. With a pixel pitch of 1.4 μm, a typical megapixel image sensor may have an overall width/length of a couple centimeters depending upon the actual pixel count. Of course, these dimensions are merely demonstrative and other dimensions may be used.

Figure 3A:
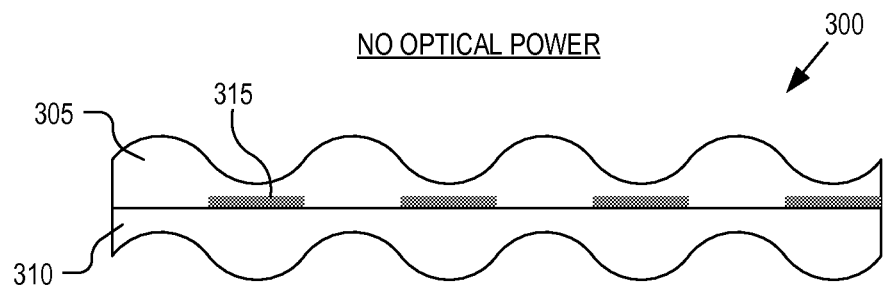
FIGS. 3A-C illustrate side views of different operational settings of an adjustable lens configured to achieve positive optical power, in accordance with an embodiment of the disclosure.
Figure 3B:
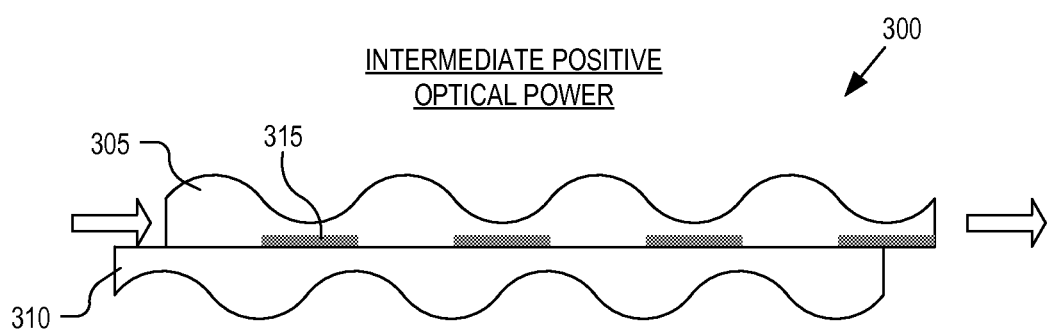
Figure 3C:
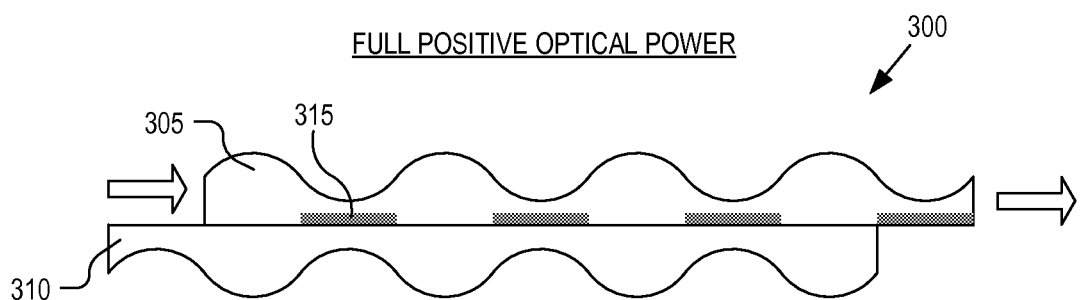
Figure 4A:
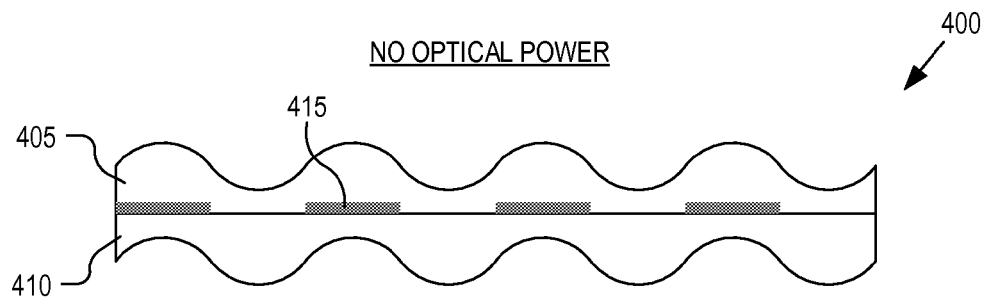
FIGS. 4A-C illustrate side views of different operational settings of an adjustable lens configured to achieve negative optical power, in accordance with an embodiment of the disclosure.
Figure 4B:
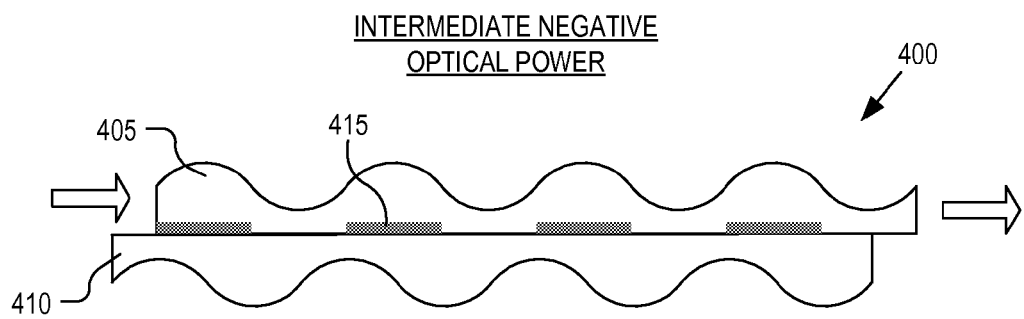
Figure 4C:
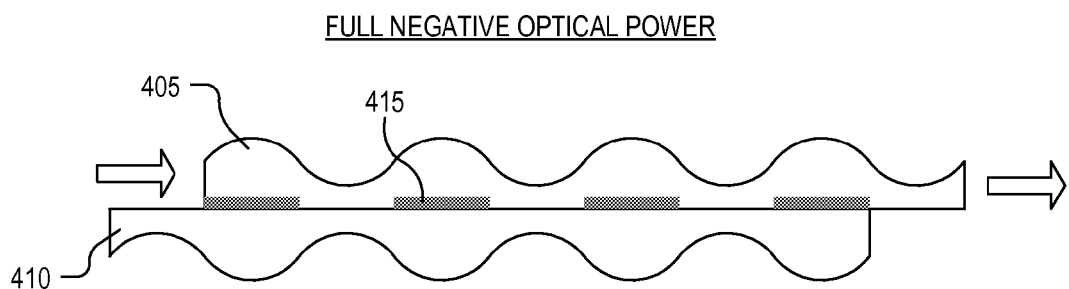

FIGS. 3 and 4 illustrate how adjustable lens 101 functions to provide variable optical power. FIGS. 3A-3C illustrate how adjustable lens 101 can be configured to provide variable positive optical power while FIGS. 4A-4C illustrates how adjustable lens 101 can be configured to provide variable negative optical power.

FIGS. 3A-C illustrate side views of different operational settings of an adjustable lens 300 configured to achieve positive optical power, in accordance with an embodiment of the disclosure. Adjustable lens 300 is one possible implementation of adjustable lens 101. Adjustable lens 300 provides positive optical power because blackout regions 315 are aligned to block groove sections of upper lens member 305. A sort of microlens array is formed by the clear regions between blackout regions 315. Adjustable lens 300 operates by sliding upper lens member 305 and lower lens member 310 laterally relative to each other. In practice, either the upper or lower or both lens members may be physically moved. In so doing, the curvature differential between the corrugated surfaces of the lens members changes, thereby changing the optical power and focal length of these column shaped microlenses. Only small lateral adjustments are needed to adjust optical power. For example, the range of movement of lens members 305 and 310 relative to each other may only be on the order of a few hundred micrometers or even less (e.g., on the order of W1 or W2).

In FIG. 3A, the upper lens member 305 is positioned relative to the lower lens member 310 such that ridge sections of upper lens member 305 are aligned with groove sections of lower lens member 310. In this relative position, adjustable lens 300 provides substantially no optical power since the corrugated surfaces are substantially parallel. In FIG. 3B, the upper lens member 305 is positioned relative to the lower lens member 310 such that their respective groove and ridges sections are partially offset. In this relative position, adjustable lens 300 provides an intermediate positive optical power since the corrugated surfaces are no longer parallel. In FIG.

3C, the upper lens member 305 is positioned relative to the lower lens member 310 such that ridge sections of upper lens member 305 are aligned with ridge sections of lower lens member 310. In this relative position, adjustable lens 300 provides maximal positive optical power by forming an array of elongated (column) convex microlenses.

FIGS. 4A-C illustrate side views of different operational settings of an adjustable lens 400 configured to achieve negative optical power, in accordance with an embodiment of the disclosure. Adjustable lens 400 is one possible implementation of adjustable lens 101. Adjustable lens 400 operates in a similar manner to adjustable lens 300, but provides negative optical power because blackout regions 415 are aligned to block ridge sections of upper lens member 405.

In FIG. 4A, the upper lens member 405 is positioned relative to the lower lens member 410 such that groove sections of upper lens member 405 are aligned with ridge sections of lower lens member 410. In this relative position, adjustable lens 400 provides substantially no optical power since the corrugated surfaces are substantially parallel. In FIG. 4B, the upper lens member 405 is positioned relative to the lower lens member 410 such that their respective groove and ridges sections are partially offset. In this relative position, adjustable lens 400 provides an intermediate negative optical power since the corrugated surfaces are no longer parallel. In FIG. 4C, the upper lens member 405 is positioned relative to the lower lens member 410 such that groove sections of upper lens member 405 are aligned with groove sections of lower lens member 410. In this relative position, adjustable lens 400 provides maximal negative optical power by forming an array of elongated (column) concave microlenses.

Figure 5A:
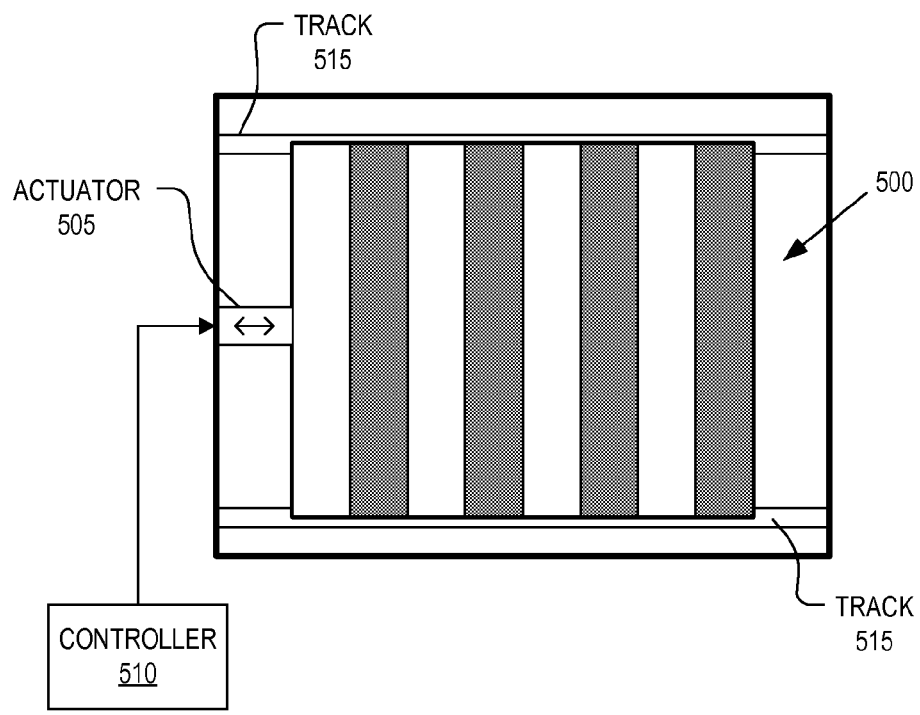
FIGS. 5A & 5B illustrate an example actuating mechanism for translating the adjustable lens to vary optical power, in accordance with an embodiment of the disclosure.
Figure 5B:
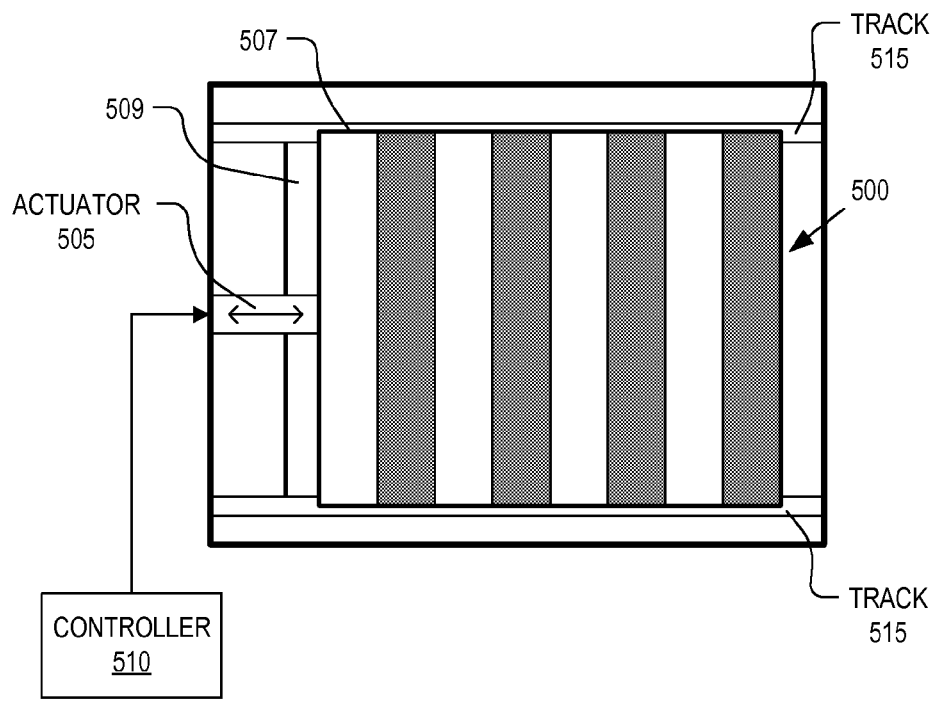

FIGS. 5A & 5B illustrate an example actuating mechanism for translating an adjustable lens 500 to vary optical power, in accordance with an embodiment of the disclosure. The actuating mechanism includes an actuator 505, a controller 510, and a track 515 for sliding adjustable lens 500 along a lateral translating path. Adjustable lens 500 is one possible implementation of adjustable lens 101.

The actuating mechanism enables the optical power of adjustable lens 500 to be varied or adjusted in real-time by actuator 505 under the influence of controller 510. In the illustrated embodiment, actuator 505 is implemented as a piezo-electric crystal that expands or contracts in response to an applied biasing signal from controller 510. The piezo-electrical crystal may be mounted to either the upper lens member 507 (illustrated) or the lower lens member 509 (not illustrated) to move the lens members relative to each other. The piezo-electric crystal may be physically mounted between a support and one of the lens members. As the piezo-electric crystal is expanded, it pushes one of the lens members (e.g., upper lens member 507) along a lateral translating path guided by tracks 515 (see FIG. 5B). Correspondingly, when the piezo-electric crystal contracts, it pulls one of the lens members back along the lateral translating path guided by tracks 515.

Tracks 515 may be implemented with a variety of different mechanical structures. Tracks 515 may be rails, grooves, channels, or anything that constrains the movement of one of the lens members relative to the other lens member along a lateral translating path. In one embodiment, the other lens member is mounted in a fixed position. Alternatively, both lens members 507 and 509 may be coupled to opposing actuators 505 and moved in opposing directions to reduce the range of lateral motion traversed by each individual lens member. Actuator 505 may be implemented using a variety of different actuating technologies including piezo-electric crystal, a MEMS device, electrostatic plates, a micro-motor, voice coil linear motor, hydraulic systems, or otherwise.

Figure 6:
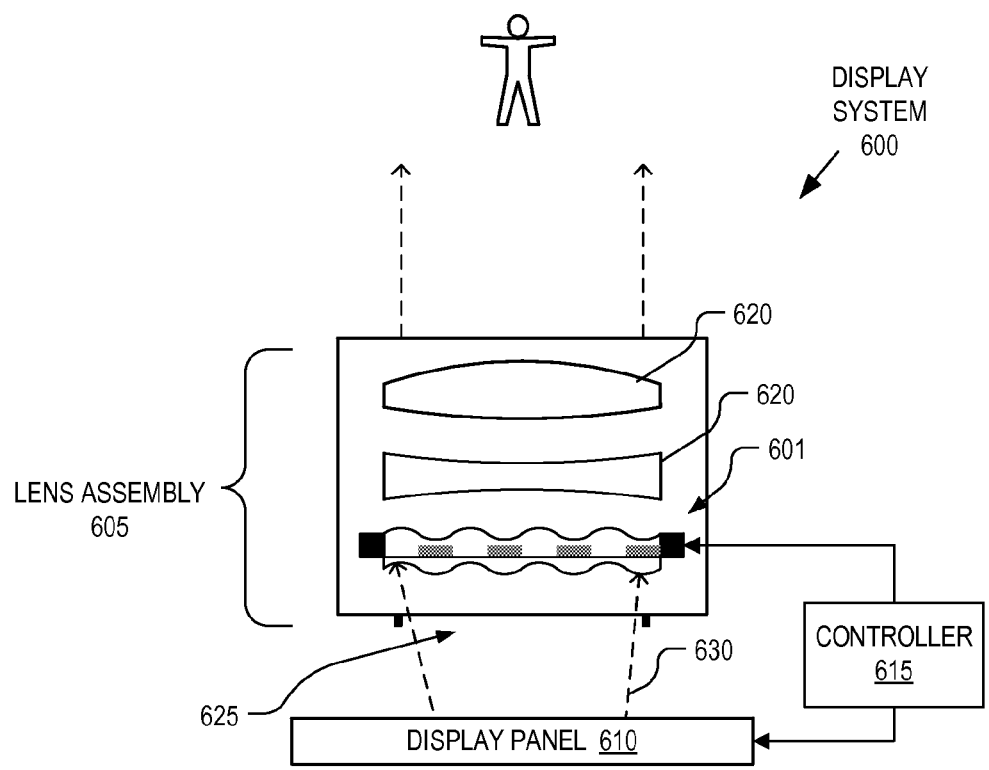
FIG. 6 is a functional block diagram illustrating a display system including an adjustable lens, in accordance with an embodiment of the disclosure.

FIG. 6 is a functional block diagram illustrating a display system 600 including an adjustable lens, in accordance with an embodiment of the disclosure. The illustrated embodiment of display system 600 includes a lens assembly 605, a display panel 610, and a controller 615. The illustrated embodiment of lens assembly 605 includes an adjustable lens 601, fixed lens elements 620, and aperture 625.

Lens assembly 605 is similar to lens assembly 105, except that it is flipped around to receive display light 630 from display panel 610, which is brought into focus for viewing by a user. Display system 600 is well suited for compact display systems, such as head mounted displays ("HMD") that emit light in near-to-eye configurations. In a HMD application, adjustable lens 601 may be used to provide an automatic zoom feature that can variably zoom images displayed to the user in real-time based upon context or user preference. Of course, display system 600 may be used in other display applications. Display panel 610 may be implemented using a variety of different display technologies including liquid crystal on silicon ("LCOS") panels, liquid crystal display ("LCD") panels, pico-projectors, light emitting diode ("LED") display panels, quantum dot arrays, or otherwise. Furthermore, display panel 610 may be monochromatic or multi-color. Thus, the adjustable lens disclosed herein may be used with a variety of electronic panels (display panels or image sensor panels) to provide a low power, high speed, and compact optical systems that have variable depth of field focusing or zoom capabilities.

Figure 7:
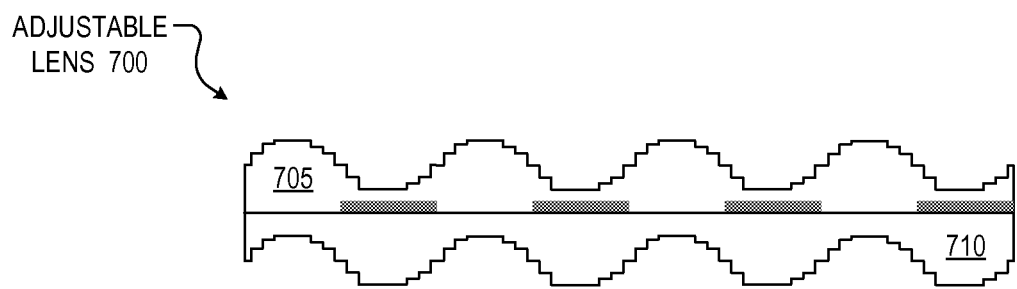
FIG. 7 illustrates one technique for fabricating an adjustable lens, in accordance with an embodiment of the disclosure.

The adjustable lenses disclosed above may be fabricated using a variety of techniques to achieve the shape of the corrugated surfaces of each lens member. FIG. 7 illustrates one such technique using grayscale lithography to fabricate an adjustable lens 700, in accordance with an embodiment of the disclosure. Grayscale lithography creates a micro-stepped structure as illustrated in FIG. 7. Alternatively, the adjustable lenses disclosed above may be fabricated using direct diamond turning. With diamond turning, the corrugated surface shape is diamond turned on a metal surface, such as nickel or steel, which is used to form a mold. The mold may subsequently be used for injection molding large number of lens members for different applications. The opaque blackout regions may be silk screened or otherwise applied or etched onto the flat surface side of one of a pair of lens members.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:
1. A camera system, comprising:
an image sensor including a pixel array for capturing image light;
an aperture through which the image light enters the camera system; and an adjustable lens disposed in an optical path of the image sensor to focus the image light received through the aperture onto the pixel array, the adjustable lens including:
- a first lens member having a first corrugated surface and a first flat surface opposite the first corrugated surface, the first corrugated surface including a periodic structure of alternating ridge and groove sections;
- a second lens member having a second corrugated surface and a second flat surface opposite the second corrugated surface, the second corrugated surface including a periodic structure of alternating ridge and groove sections, wherein the second flat surface is oriented to face the first flat surface; and
- blackout regions disposed between the first and second corrugated surfaces and positioned to block the image light passing through either the ridge sections of the first lens member, or alternatively, the groove sections of the first lens member.

2. The camera system of claim 1, wherein the periodic structures of the first and second lens members each include a plurality of ridge sections and a plurality of groove sections to span the aperture and the image sensor.

3. The camera system of claim 2, wherein each of the ridge sections of both the first and second corrugated surfaces subtends a plurality of image pixels of the pixel array along both a width dimension and a length dimension that is orthogonal to the width dimension, and wherein each of the groove sections of both the first and second corrugated surfaces subtends a plurality of the image pixels along both the width dimension and the length dimension.

4. The camera system of claim 3, wherein the periodic structure of both the first and second corrugated surfaces comprise columns of the ridge sections that alternate with columns of the groove sections.

5. The camera system of claim 4, wherein the blackout regions comprise a pattern of blackout columns.

6. The camera system of claim 1, wherein the blackout regions are disposed on either the first flat surface or the second flat surface.

7. The camera system of claim 1, further comprising:
an actuator coupled to the adjustable lens to slide at least one of the first or second lens members relative to each other to adjust an optical power of the adjustable lens.

8. The camera system of claim 7, further comprising:
a track to guide one of the first or second lens members along a translating path; and
a fixed mount to hold the other one of the first or second lens members in a fixed position.

9. The camera system of claim 8, wherein the actuator comprises:
a controller; and
a piezo-electric crystal mechanically coupled to expand or contract under influence of the controller to move one of the first or second lens members along the translating path.

10. The camera system of claim 8, wherein the actuator comprises:
a controller; and
a micro-electro-mechanical-system ("MEMS") mechanically coupled to translate one of the first or second lens members along the translating path under influence of the controller.

11. The camera system of claim 1, wherein adjustable lens is included within a lens assembly, the lens assembly further comprising:
one or more additional lenses disposed between the adjustable lens and the image sensor.

12. The camera system of claim 11, wherein the image sensor comprises a complementary metal-oxide-semiconductor ("CMOS") image sensor including a color filter array disposed over the pixel array and a microlens array disposed over the color filter array.

13. An optical system, comprising:
an aperture through which image light passes; and
an adjustable lens disposed in an optical path of the image light to focus the image light received through the aperture, the adjustable lens including:
- a first lens member having a first corrugated surface and a first flat surface opposite the first corrugated surface, the first corrugated surface including a periodic structure of alternating ridge and groove sections;
- a second lens member having a second corrugated surface and a second flat surface opposite the second corrugated surface, the second corrugated surface including a periodic structure of alternating ridge and groove sections, wherein the second flat surface is oriented to face the first flat surface; and
- blackout regions disposed between the first and second corrugated surfaces and positioned to block the image light passing through either the ridge sections of the first lens member, or alternatively, the groove sections of the first lens member.

14. The optical system of claim 13, further comprising:
an electronic panel including a pixel array, wherein the periodic structures of the first and second lens members each include a plurality of ridge sections and a plurality of groove sections to span the aperture and the electronic panel.

15. The optical system of claim 14, wherein each of the ridge sections of both the first and second corrugated surfaces subtends a plurality of pixels of the pixel array along both a width dimension and a length dimension that is orthogonal to the width dimension, and wherein each of the groove sections of both the first and second corrugated surfaces subtends a plurality of the pixels along both the width dimension and the length dimension.

16. The optical system of claim 15, wherein the periodic structure of both the first and second corrugated surfaces comprise columns of the ridge sections that alternate with columns of the groove sections.

17. The optical system of claim 16, wherein the blackout regions comprise a pattern of blackout columns and wherein the blackout regions are disposed on either the first flat surface or the second flat surface.

18. The optical system of claim 14, wherein the electronic panel comprises one of a display panel with an array of display pixels or an image sensor with an array of image pixels.

19. The optical system of claim 13, further comprising:
an actuator coupled to the adjustable lens to slide at least one of the first or second lens members relative to each other to adjust an optical power of the adjustable lens;
a track to guide one of the first or second lens member along a translating path; and
a fixed mount to hold the other one of the first or second lens member in a fixed position.

20. The optical system of claim 19, wherein the actuator comprises:
a controller; and
a piezo-electric crystal to expand or contract under influence of the controller to move the first or second lens member along the translating path.

21. The optical system of claim 19, wherein the actuator comprises:
   a controller; and
   a micro-electro-mechanical-system ("MEMS") mechanically coupled to translate the first or second lens member along the translating path under influence of the controller.

* * * * *